United States Patent
Kaviani et al.

(10) Patent No.: US 6,847,246 B1
(45) Date of Patent: Jan. 25, 2005

(54) METHOD AND APPARATUS FOR REDUCING JITTER AND POWER DISSIPATION IN A DELAY LINE

(75) Inventors: Alireza S. Kaviani, San Jose, CA (US); Patrick T. Lynch, Edenderry (IE); Paul G. Hyland, Naas (IE); Patrick J. Crotty, San Jose, CA (US); Tao Pi, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/284,725

(22) Filed: Oct. 31, 2002

(51) Int. Cl.[7] .............................................. H03H 11/26
(52) U.S. Cl. ......................... 327/276; 327/407; 327/277
(58) Field of Search .......................... 327/231, 276–278, 327/407, 156, 158, 284, 261, 270

(56) References Cited

U.S. PATENT DOCUMENTS

| | | | |
|---|---|---|---|
| 5,900,761 A | * | 5/1999 | Hideno et al. ............... 327/261 |
| 6,069,506 A | * | 5/2000 | Miller, Jr. et al. ........... 327/156 |
| 6,191,613 B1 | | 2/2001 | Schultz et al. ................. 326/39 |
| 6,204,710 B1 | | 3/2001 | Goetting et al. ............. 327/276 |
| 6,222,894 B1 | * | 4/2001 | Lee .............................. 327/153 |
| 6,289,068 B1 | | 9/2001 | Hassoun et al. ............. 327/158 |
| 6,384,647 B1 | | 5/2002 | Logue .......................... 327/153 |
| 6,400,735 B1 | | 6/2002 | Percey ......................... 327/407 |
| 6,469,559 B2 | * | 10/2002 | Heightley .................... 327/278 |

* cited by examiner

Primary Examiner—Dinh T. Le
(74) Attorney, Agent, or Firm—W. Eric Webostad; Justin Liu; Edel M. Young (57) ABSTRACT

Method and apparatus for reducing power dissipation and jitter in a delay line is described. The delay line includes a plurality of delay elements. At least one of the plurality of delay elements includes a gate terminal configured to receive gate control signals for activating or deactivating one or more of the delay elements. The delay line further includes gate control circuitry for providing gate control signals to the gate terminal of at least one of the plurality of delay elements.

23 Claims, 8 Drawing Sheets

METHOD AND APPARATUS FOR REDUCING JITTER AND POWER DISSIPATION IN A DELAY LINE

FIELD OF THE INVENTION

One or more aspects of the present invention relate generally to delay lines for digital systems and, more particularly, to reducing jitter and power dissipation in a delay line.

BACKGROUND OF THE INVENTION

Delay lines are used in clock management blocks of integrated circuit (IC) devices, such as field programmable gate arrays (FPGAs), to control timing of various signals therein. A simple delay line receives an input signal on an input terminal and provides an output signal on an output terminal, where the output signal is delayed by a certain time period that is referred to as delay, D, of the delay line.

An IC device such as an FPGA can use a delay line in a digital clock management (DCM) block to synchronize clock signals. Delay lines typically comprise a number of delay elements and may be, for example, voltage controlled or tap-controlled. In tap-controlled delay lines, the delay elements are commonly referred to as "taps."

In DCM circuits, excess jitter and power dissipation in a delay line can deleteriously affect performance of the circuit. Power dissipation in a delay line is a function of switching activity. One contributing factor to jitter in single-ended delay lines is power supply noise (including GND bounce). Jitter in a delay line increases proportionally with power supply noise. Power supply noise is proportional to the time derivative of the instantaneous current i(t) drawn from the power supply d(i)/dt. Thus, high-frequency current changes on the power supply of the delay line increase jitter. While circuits exist to protect delay lines from external noise sources, little attention has been given to local noise sources generated by running taps in tap-controlled delay lines and their corresponding circuits.

Accordingly, it would be both desirable and useful to provide method and apparatus for reducing jitter and power dissipation in a delay line.

SUMMARY OF THE INVENTION

Method and apparatus for reducing power dissipation and jitter in a delay line are provided in accordance with one or more aspects of the present invention. The delay line comprises a plurality of delay elements. At least one of the plurality of delay elements includes a gate terminal for activating and deactivating one or more of the delay elements. The delay line further comprises gate control circuitry for providing gate control signals to the gate terminal of at least one of the delay elements.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

The present invention provides method and apparatus for reducing power dissipation and jitter in a delay line. The present invention can be employed in digital clock management (DCM) circuits of field programmable gate arrays (FPGAs) to eliminate clock skew, for example. While the present invention is described with specific reference to DCM circuits of an FPGA, those skilled in the art will appreciate that the present invention can be used in any digital system employing delay line circuitry for various applications, including ASSPs, ASICs, micro-DSPs, and the like.

Figure 1:
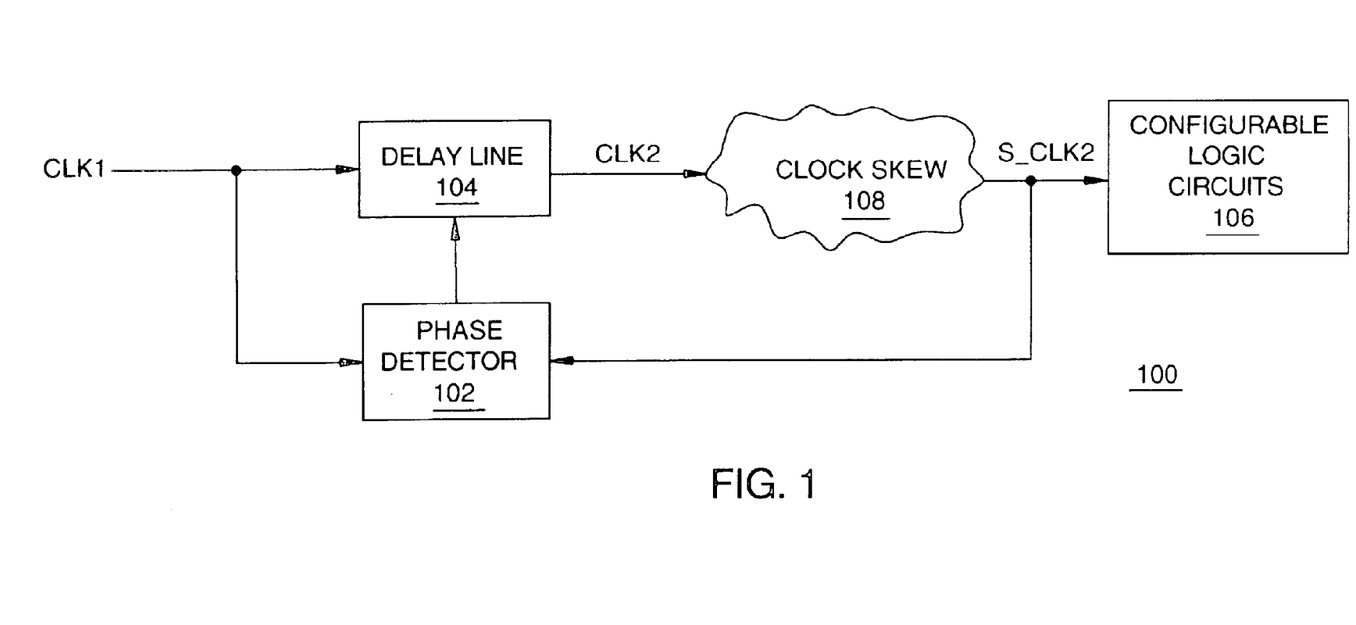
FIG. 1 depicts a block diagram of an exemplary digital system in which the present invention is useful.

FIG. 1 depicts a block diagram of an exemplary embodiment of a digital system 100 in which the present invention is useful. Digital system 100 includes a phase detector 102, a delay line 104, and configurable logic circuits 106. Clock signal CLK1 is coupled to an input terminal of delay line 104. Delay line 104 drives a clock signal CLK2 to configurable logic circuits 106 under control of phase detector 102.

However, before clock signal CLK2 reaches configurable logic circuits 106, clock signal CLK2 may be skewed by various factors, such as capacitive and resistive loading and propagation delay. One or more various skewing factors are represented by clock skew 108. Thus, configurable logic circuits 106 are actually driven by skewed clock signal S_CLK2. For proper operation of configurable logic circuits 106, clock signal CLK1 is synchronized with skewed clock signal S_CLK2 by adjusting delay line 104 such that delay, D, plus skew delay, S_D, is equal to a multiple of the period of clock signal CLK1. Specifically, phase detector 102 is responsive to clock signal CLK1 and skewed clock signal S_CLK2. Phase detector 102 generates a control signal for controlling the delay, D, of delay line 104 in a well-known manner.

To compensate for different clock skews at different frequencies, delay line 104 may be configured to insert different delays to operate over a wide range of frequencies, for example 10 MHz to 500 MHz. In one embodiment, the number of delay elements or taps in delay line 104 is a function of the lowest operable frequency (i.e., longest delay). For higher operating frequencies (i.e., less delay), jitter in delay line 104 becomes more critical. Delay line 104 incorporates gated taps, which allows for automatic deactivation of taps that are not in use. Thus, local noise and power may be reduced by an order of magnitude when delay line 104 is operating at higher frequencies.

Figure 2:
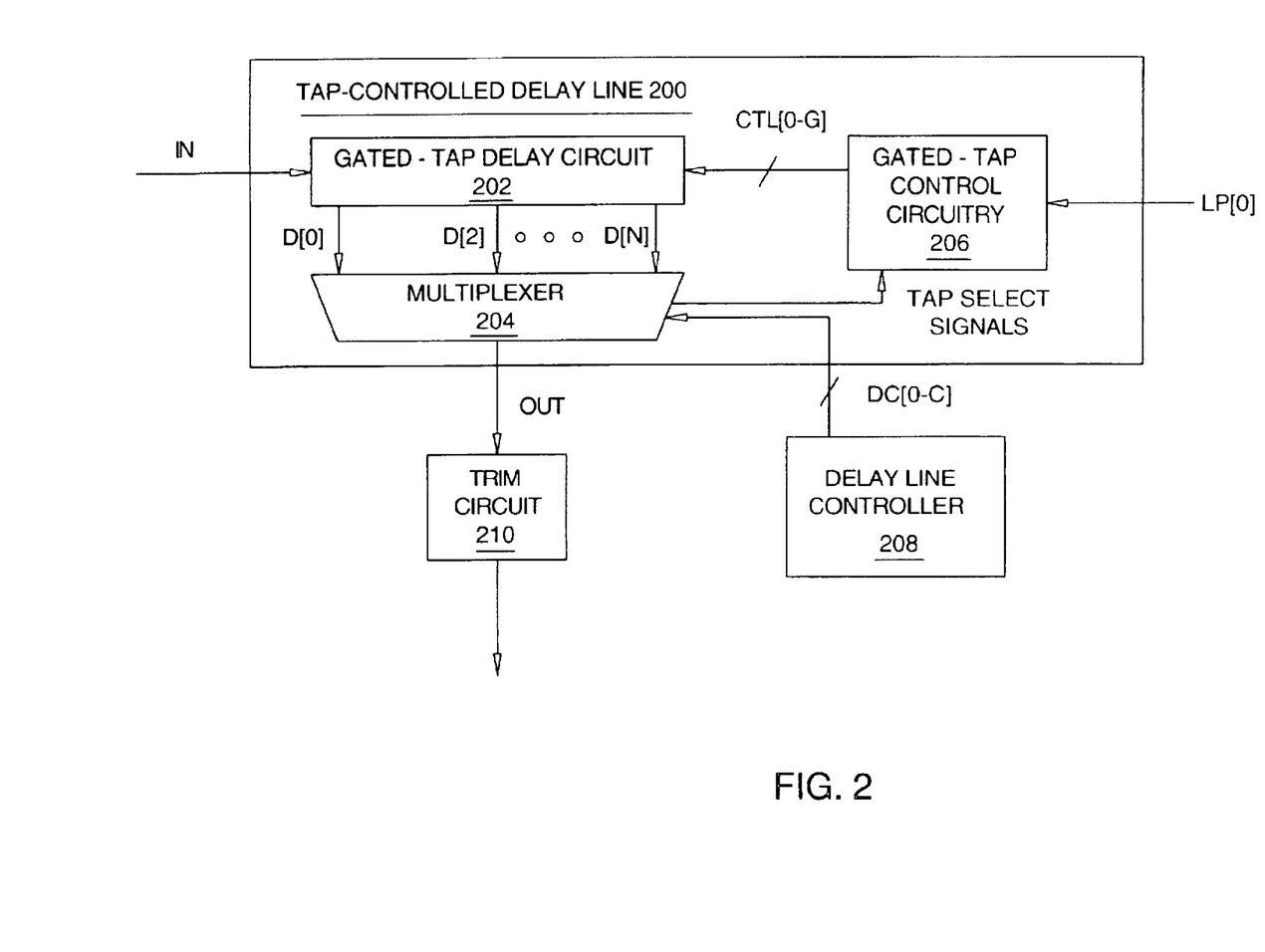
FIG. 2 depicts a high-level block diagram showing one embodiment of a delay line in accordance with one or more aspects of the present invention.

FIG. 2 depicts a high-level block diagram showing an exemplary embodiment of a tap-controlled delay line 200 in accordance with one or more aspects of the present invention. Delay line 200 includes a gated tap delay circuit 202, a multiplexer 204, and gated tap control circuitry 206. Delay line 200 has an input terminal IN, an output terminal OUT, a control input LP[0], and delay control terminals DC[0–C], where C is an integer greater than zero. A delay line controller 208 drives delay control signals DC[0–C] to delay line 200. Briefly stated, delay line 200 provides an output signal OUT that is a copy of the input signal delayed by an amount selected by delay line controller 208.

To avoid confusion, terminals are referred to with the same identifier as the signals driven by the terminal. For example, delay control signal DC[1] is driven to delay control terminal DC[1] of delay line 200. Also, as used herein, signals that logically form groups are referred to using a group name followed by brackets enclosing a number for each signal. If more than one signal is referred to simultaneously, brackets containing a range of numbers are used. For example, delay control signals DC[0–C] comprise DC[0], DC[1], DC[2] . . . DC[C-1], and DC[C] signals.

Gated tap delay circuit 202 is configured to receive input signal IN and provide a plurality of delayed output signals D[0–N], where N is an integer greater than zero. Each of output signals D[0–N] of gated tap delay circuit 202 is a copy of input signal IN delayed by some multiple of a basic delay, D, of gated tap delay circuit 202, where delay, D, may be a fixed increment to provide a basic delay. Generally, delayed output signal D[X] is a copy of input signal IN delayed by x times basic delay, D. The N sequentially ordered delayed output terminals D[0–N] of gated tap delay circuit 202 are driven to N sequentially ordered input terminals D[0–N] of multiplexer 204.

Multiplexer 204 has C control terminals, which are configured to receive delay control signals DC[0–C], and an output terminal configured to provide output signal OUT. In an embodiment, multiplexer 204 is or comprises a Gray code multiplexer and delay line controller 208 outputs Gray code delay control signals as control signals DC[0–C] to control selection of signals D[0–N] to provide as output signal OUT. Use of a Gray code multiplexer avoids or reduces glitches in delay line 200 when switching between consecutive multiples of basic delay, D. Alternatively, multiplexer 204 can operate using ordinary binary signals output by delay line controller 208.

The value C may be set to equal the smallest positive integer greater than or equal to log base two of N. For example, if there are N=128 taps in gated tap delay circuit 202, delay line controller 208 drives C=7 delay control signals to delay line 200. Output terminal OUT of delay line 200 is coupled to an optional trim circuit 210. As is well known, a trim circuit may be used with a delay line to provide delays smaller than a base delay of such a delay line. Trim circuit 210 may be another delay line 200, though with a finer granularity of a basic delay, D.

Multiplexer 204 drives an output signal of delayed output signals D[0–N] from gated tap delay circuit 202 to output terminal OUT of delay line 200 under control of delay control signals DC[0–C]. Input terminals of multiplexer 204 are mapped to values of multiplexer control signals DC[0–C] so that delay control signals DC[0–C] can select a desired delayed output signal. Operation of illustrative embodiments of multiplexer 204 is described below in more detail.

Gated tap delay circuit 202 is configured to receive gate control signals CTL[0–G], where G is an integer greater than zero. Gated tap control circuitry 206 drives gate control signals CTL[0–G] to gated tap delay circuit 202. Gate control signals CTL[0–G] control which taps in gated tap delay circuit 202 are active. If less than all of the taps are needed, gated tap control circuitry 206 outputs gate control signals CTL[0–G] that operate to deactivate one or more of the taps. Gated tap control circuitry 206 determines which taps are allowed to be deactivated using tap select signals from multiplexer 204. As described above, multiplexer 204 in response to delay line controller 208 controls which delayed output signal is output from delay line 200, and thus controls which tap in gated tap delay circuit 202 is selected to provide a target delay. Gated tap control circuitry 206 uses this tap select information to disable one or more unused taps.

Gated tap control circuitry 206 receives a configuration signal LP[0]. If configuration signal LP[0] is in an active state, gated tap control circuitry 206 operates to deactivate unused taps. Otherwise, gated tap control circuitry 206 does not deactivate any taps. Operation of illustrative embodiments of gated tap control circuitry 206 is described below in more detail below.

Figure 3A:
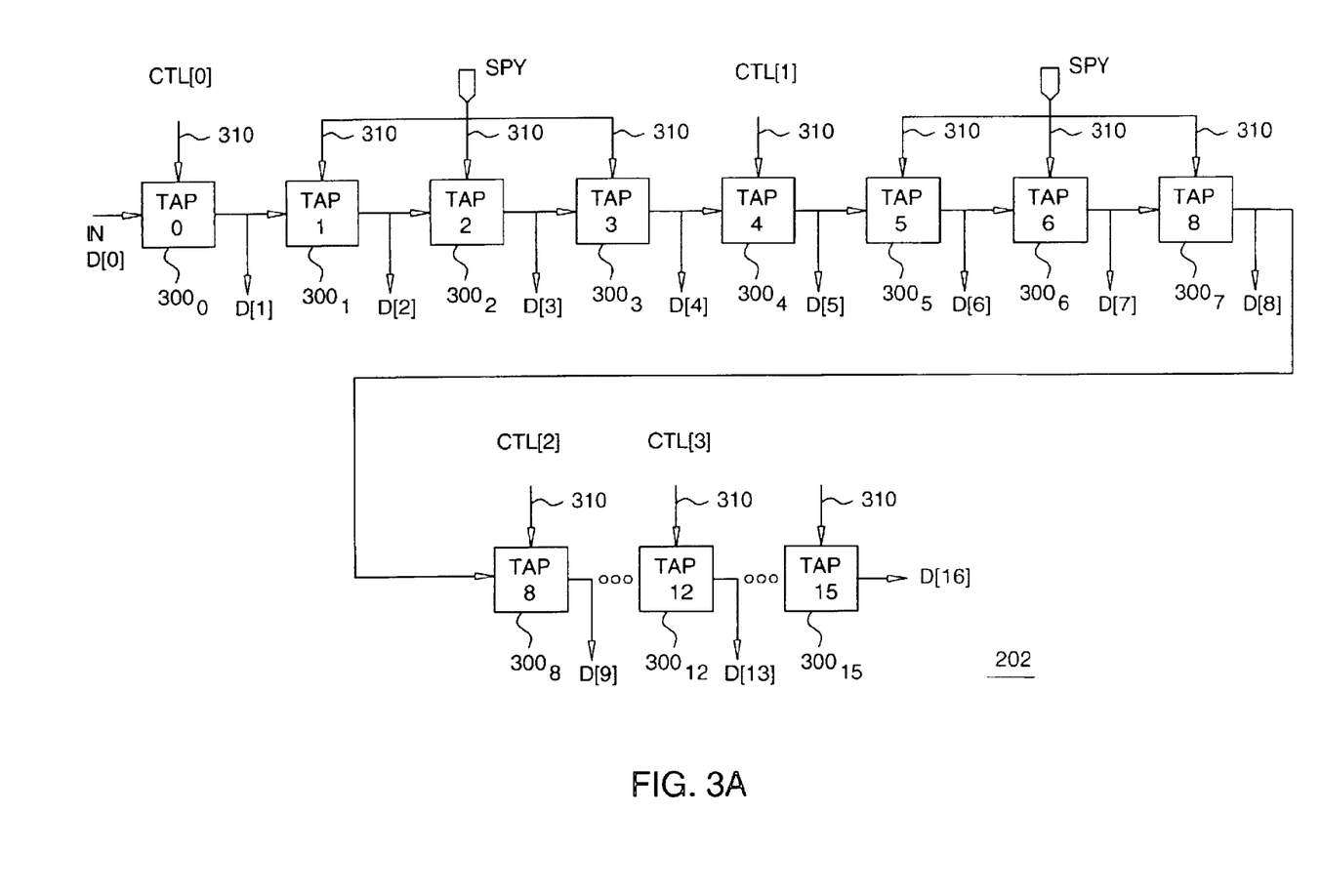
FIG. 3A depicts a block diagram showing a gated tap delay circuit in accordance with one or more aspects of the present invention.
Figure 3B:
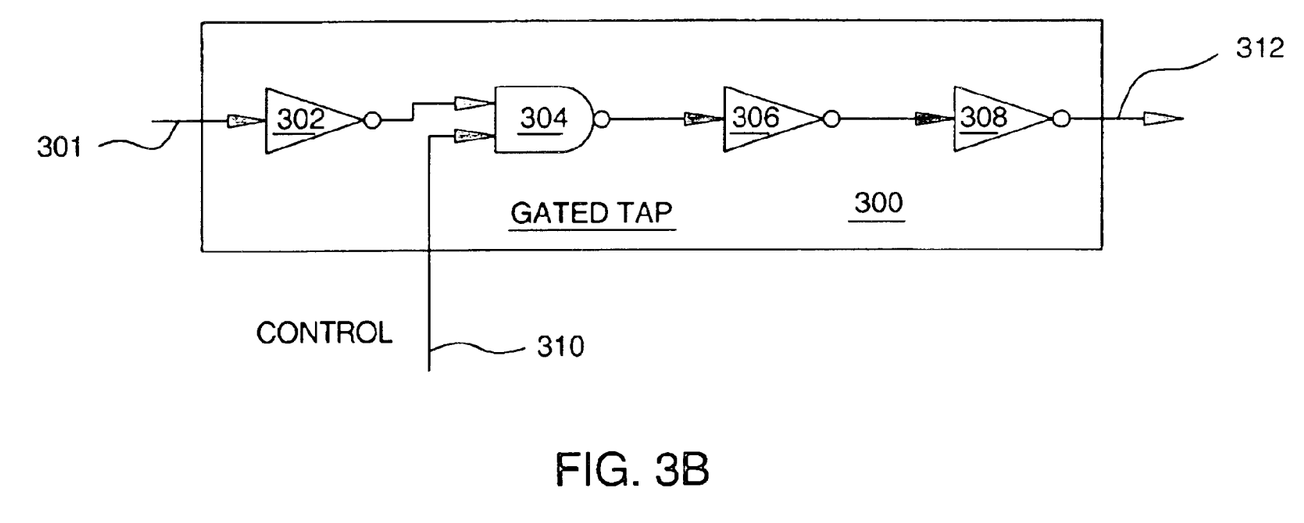
FIG. 3B depicts a schematic diagram showing a gated tap in accordance with one or more aspects of the present invention.

FIG. 3A depicts a block diagram showing an illustrative embodiment of gated tap delay circuit 202 in accordance with one or more aspects of the present invention. FIG. 3B depicts a schematic diagram showing an embodiment of a gated tap 300 in accordance with one or more aspects of the present invention.

With simultaneous reference to FIGS. 3A and 3B, gated tap delay circuit 202 illustratively includes 16 gated taps $300_0$ through $300_{15}$ (collectively referred to as gated taps 300), which respectively provide delayed output signals D[1–16], where D[0] is input signal IN. While only 16 taps are shown for clarity, gated tap delay circuit 202 may employ any number of gated taps 300. Gated taps 300 are serially coupled to provide a single ended delay line. Alternatively, gated taps 300 can be differential delay elements.

As shown in FIG. 3B, each of gated taps 300 includes a first inverter 302, a NAND gate 304, a second inverter 306, and a third inverter 308. A particular gated tap $300_X$ (where X is an integer from 0 to 15) is configured to receive an input signal via input terminal 301, and a gate control signal via control terminal 310. A gated tap $300_X$ is configured to output via output terminal 312 a copy of the input signal delayed by a basic delay, D, of gated tap $300_X$.

More specifically, input terminal 301 of gated tap $300_X$ is coupled to a lead delay element, namely, inverter 302. The output of inverter 302 is coupled to an input of a gating element, namely, NAND gate 304. Notably, NAND gate 304 acts as a delay element. Gate control terminal 310 is coupled to another input of NAND gate 304. The output of NAND gate 304 is coupled to an intermediate delay element, namely, inverter 306. The output of inverter 306 is coupled to an end delay element, namely, inverter 308. The output of inverter 308 is coupled to output terminal 312.

When gate control terminal 310 is driven by logic high signal, NAND gate 304 effectively operates as an inverter with respect to received output from inverter 302. Logically, inverter 302, NAND gate 304, inverter 306, and inverter 308 maintain input signal 301 at a same logic level as output signal 312, while providing a propagation delay, D. Thus, for a gated tap $300_X$, base delay, D, is equal to a cumulative propagation delay of inverter 302, NAND gate 304, second inverter 306, and inverter 308.

Conversely, when gate control terminal 310 is driven by a logic low signal, NAND gate 304 "deactivates" gated tap $300_X$. In the deactivated state, a gated tap $300_X$ always outputs a logic high signal at output terminal 312. Thus, output signal 312 will not change in response to a change in input signal 301.

Returning to FIG. 3A, gated taps $300_0$ through $300_{15}$ are illustratively coupled in series so that input terminal 301 of gated delay element $300_X$ is coupled to output terminal 312 of gated delay element $300_{X-1}$. Input terminal 301 of gated delay element $300_0$ is coupled to input terminal IN. Gated zap delay circuit 202 includes four gate control terminals CTL[0–3], which are respectively coupled to the respective gate control terminals 310 of gated taps $300_0$, $300_4$, $300_8$, and $300_{12}$. The respective gate control terminals 310 of the remaining gated taps 300 are driven by a logic high signal, for example connected to a supply voltage SPY.

Thus, gated taps 300 can be turned on and off at a granularity of four taps. That is, if the control signal CTL[0] is driven by a logic low signal, the entire gated tap delay circuit 202 is deactivated. If the control signal CTL [0] is instead driven by a logic high signal, and control signal CTL[1] is driven by a logic low signal, only the first four gated taps $300_0$ through $300_3$ are activated. The next four gated taps $300_4$ through $300_7$ are activated by driving control signals CTL[0–1] with logic high signals, and driving control signal CTL[2] with a logic low signal. The entire gated tap delay circuit 202 is activated by driving control signals CTL[0–3] with logic high signals.

Gated taps 300 are controllably activated in predefined groups of taps. If gated taps 300 were to be turned on and off at a granularity of eight taps, only two control signals would be needed: one control signal would be coupled to gate control terminal 310 of gated tap $300_0$, and the other control signal would be coupled to gate control terminal 310 of gated tap $300_8$. The respective gate control terminals 310 of the remaining gated taps 300 would be driven by a logic high signal. The lowest granularity is a granularity of a single gated tap. In that case, each of the gated taps 300 would receive a separate gate control signal.

Although NAND gate 304 is shown in the second stage of a four stage gated tap $300_X$, NAND gate 304 may be placed in any of the stages (e.g., in the third stage). In addition, gated taps 300 may include any even number of stages other than the four stage design shown in FIG. 3B. For example, a two stage gated tap can be used, where one of the stages comprises a NAND gate. Furthermore, those skilled in the art will appreciate that other types of logic gates can be used, such as AND gates, in various configurations to form a delay element having a gate control terminal.

Figure 4:
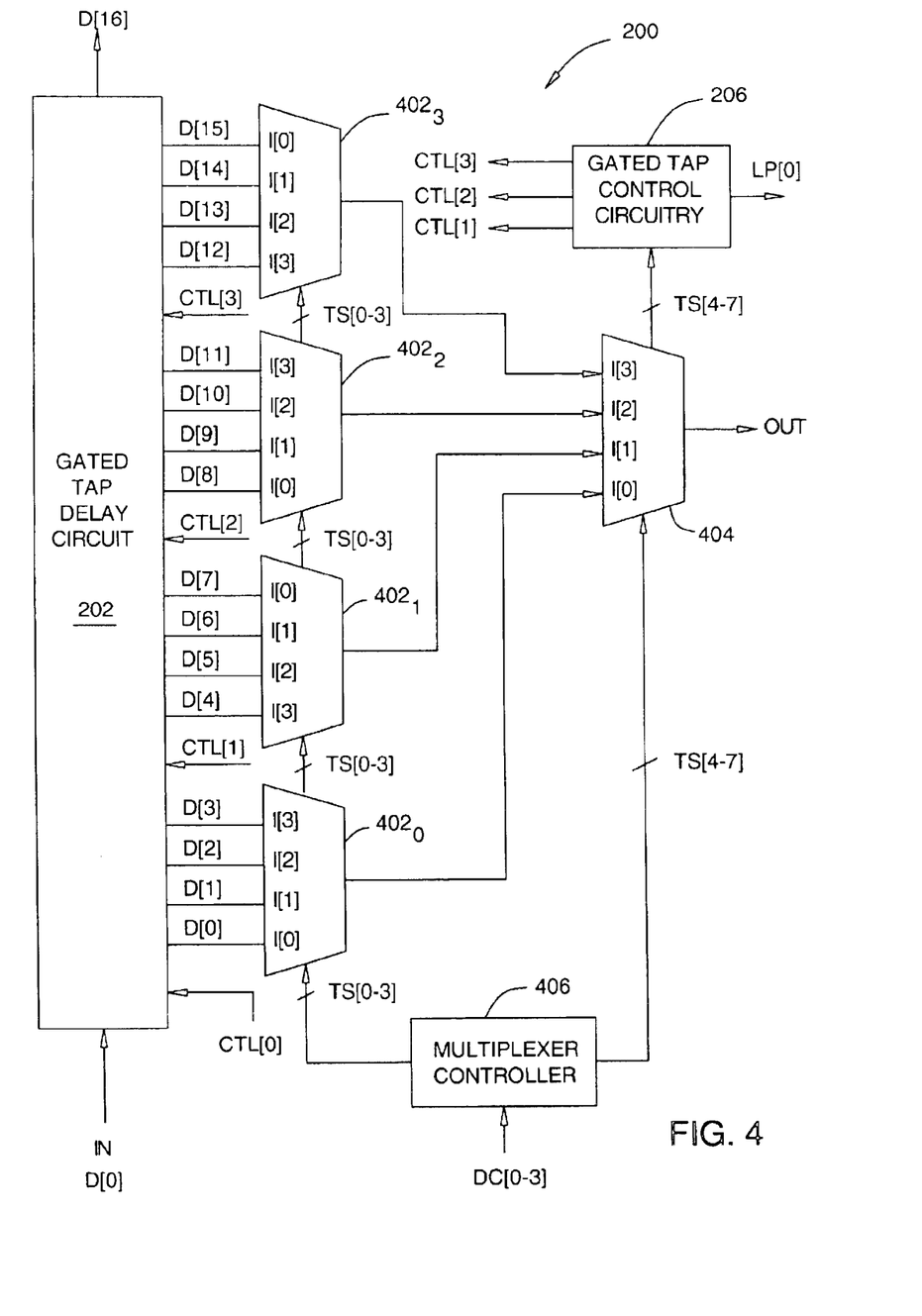
FIG. 4 depicts a block diagram of a 16-tap delay line in accordance with one or more aspects of the present invention.

FIG. 4 depicts a more detailed block diagram showing an exemplary embodiment of delay line 200 in accordance with one or more aspects of the present invention. Elements that are similar to those described with respect to FIG. 2 are designated with identical reference numerals and are described above. In this illustrative embodiment, delay line 200 includes a gated tap delay circuit 202 having 16 taps for delaying input signal IN, for example, as shown for gated tap delay circuit 202 of FIG. 3A. Multiplexer 204 of delay line 200 is a two level Gray code multiplexer tree comprising multiplexers $402_0$ through $402_3$ (collectively referred to as multiplexers 402), multiplexer 404, and multiplexer controller 406. Multiplexer controller 406 is configured to receive delay control signals DC[0–3] (a four-bit delay control signal is used to control 16 taps) and to generate tree select control lines TS[0–7]. Tree select control lines TS[0–7] control multiplexers 402 and 404 to select an appropriate delayed output signal, as explained in greater detail below.

Multiplexers 402 are 4-to-1 multiplexers that select one of the four input signals as an output signal. Thus, multiplexers 402 are each coupled to receive a 4-member subset of delayed output signals and drive an output signal. Specifically, multiplexers $402_0$, $402_1$, $402_2$, and $402_3$ receive delayed output signals D[0–3], D[4–7], D[8–11], and D[12–15], respectively. The output signal of each of multiplexers 402 is coupled to multiplexer 404. Multiplexers 402 are controlled in parallel by tree select control lines TS[0–3].

Multiplexer 404 is a 4-to-1 multiplexer that selects one of the four input signals to drive as an output signal. Thus, multiplexer 404 is configured to receive four signals from multiplexers 402 and to drive one output signal as output signal OUT. Multiplexer 404 is controlled by tree select control lines TS[4–7].

Each input terminal of multiplexers 402 and 404 is labeled I[X], where X is an integer between 0–3, inclusive. Each input terminal I[X] of multiplexers 402 and 404 corresponds to a selected line coupled as input to multiplexer 404 and is selected by driving a corresponding select line signal TS[0–7] to an active state. Multiplexer controller 406 drives one of the select lines on each multiplexer to an active state to select a corresponding input terminal. Implementation details for this exemplary embodiment for specific correspondence between select lines and input terminals are explained below.

Multiplexer $402_0$ receives delayed output signals D[0–3] and drives an output signal to input terminal I[0] of multiplexer 404. Multiplexer $402_1$ receives delayed output signals D[4–7] and drives an output signal to I[1] of multiplexer 404. Multiplexer $402_2$ receives delayed output signals D[8–11] and drives an output signal to I[2] of multiplexer 404. Multiplexer $402_3$ receives delayed output signals D[12–15] and drives an output signal to I[3] of multiplexer 404.

Multiplexers 402 are operated in parallel by multiplexer controller 406 since select lines of multiplexers 402 are coupled in parallel to receive tree select control signals TS[0–3]. Input terminal I[0] is selected in all multiplexers 402 if tree select control line TS[0] is in an active state. Similarly, input terminals I[1–3] are selected in all multiplexers 402 if tree select control lines TS[1–3] are in an active state. For example, if tree select control line TS[1] is in an active state, multiplexer $402_0$ provides delayed output signal D[1], multiplexer $402_1$ provides delayed output signal D[6], multiplexer $402_2$ provides delayed output signal D[9], and multiplexer $402_3$ provides delayed output signal D[14]. To properly implement a Gray code selection scheme, inputs of every other one of multiplexers 402 are in reverse order. Multiplexer 404 operates similarly to multiplexers 402 using tree select control lines TS[4–7].

Multiplexer controller 406 operates to decode delay control signals DC[0–3] into tree select control signals TS[0–7]. Multiplexer 404 may be implemented using a Gray code scheme. Delay control signals D[0–1] control the values of tree select control signals TS[0–3], and delay control signals D[2–3] control the values of tree select control signals TS[4–7]. TABLE 1 shows a truth table for an active low embodiment of a decoding process that may be performed by multiplexer controller 406 for delay control signals D[0–1]. Decoding of delay control signals D[2–3] can be performed in the same manner. For an active high embodiment, the output signals are logically inverted.

TABLE 1

| D[1] | D[0] | TS[3] | TS[2] | TS[1] | TS[0] |
|------|------|-------|-------|-------|-------|
| 0 | 0 | 1 | 1 | 1 | 0 |
| 0 | 1 | 1 | 1 | 0 | 1 |
| 1 | 1 | 1 | 0 | 1 | 1 |
| 1 | 0 | 0 | 1 | 1 | 1 |

As described above with respect to FIGS. 2 and 3A, taps of gated tap delay circuit 202 are turned off and on at a granularity of four taps. Thus, gated tap delay circuit 202 comprises four gate control terminals CTL[0–3]. Gate control terminal CTL[0] controls activation of the entire delay line. Thus, when gate control signal CTL[0] is driven by an active signal (logic high signal), gated tap delay circuit 202 is activated. Gate control terminals CTL[1–3] are driven by respective gate control signals CTL[1–3] output from gated tap control circuitry 206. Gated tap control circuitry 206 is configured to receive tree select control signals TS[4–7]. Gated tap control circuitry 206 determines from the tree select control signals which taps will not be used to provide the selected delay to the input signal, and thus generate the requisite gate control signals CTL[1–3] for disabling unused taps. Since the taps are turned on and off at a granularity of four taps, gated tap control circuitry 206 only requires information from tree select control signals TS[4–7].

Figure 5:
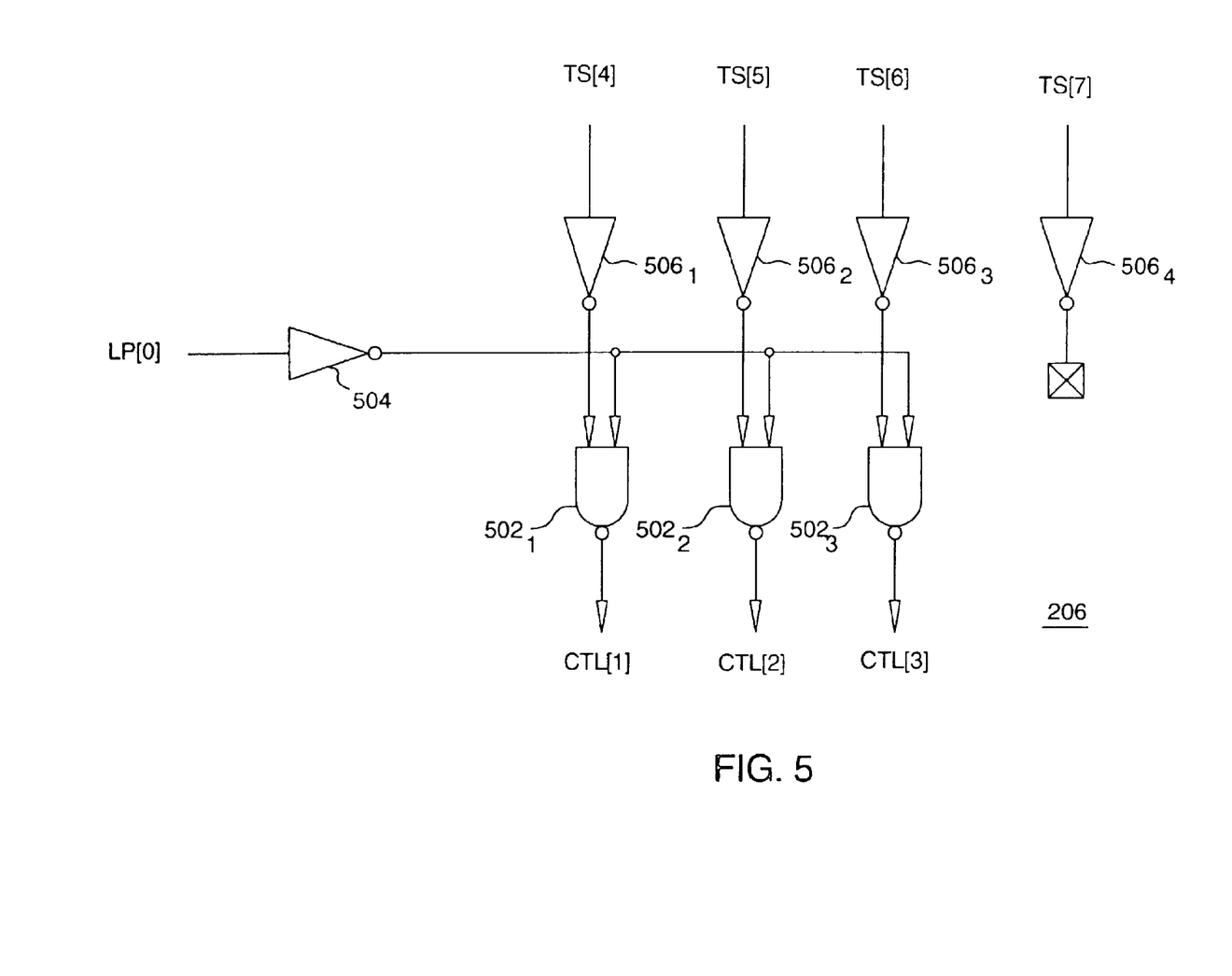
FIG. 5 depicts a block diagram of a gated tap control circuit for the 16-tap delay line of FIG. 4 in accordance with one or more aspects of the present invention.

FIG. 5 depicts a more detailed schematic diagram showing an exemplary embodiment of the gated tap control circuitry 206. Gated tap control circuitry 206 outputs gate control signals CTL[1–3] for controlling taps at a granularity of four taps. Gated tap control circuitry 206 includes a plurality of NAND gates $502_1$ through $502_3$ (collective referred to as NAND gates 502), an inverter 504, and a plurality of inverters $506_1$ through $506_4$ (collectively referred to as inverters 506). Those skilled in the art will appreciate that other types of logic gates can be used, such as AND gates, to provide gate control signals.

Configuration signal LP[0] feeds inverter 504. The output of inverter 504 is coupled to an input of each of NAND gates 502. When configuration signal LP[0] is in an active state (such as active low), gated tap control circuitry 206 outputs either logic high or logic low output signals for controlling activation of taps of gated tap delay circuit 202 in accordance with tree select control signals TS[4–7]. Otherwise, all gate control terminals CTL[1–3] are driven with logic high signals, which cause every tap in gated tap delay circuit 202 to be activated regardless of the state of tree select control lines TS[4–7].

The tree select control signals TS[4–7] are respectively coupled to inverters $506_1$ through $506_4$. The outputs of inverters $506_1$ through $506_3$ are respectively coupled to another input of each NAND gate $502_1$ through $502_3$. The output of inverter $506_4$ is not connected. As described above, only one of tree select control signals TS[4–7] is in an active state at any one time (such as active low). The state of gate control signals CTL[1–3] depends on which tree select control signal TS[4–7] is in the active state, as explained below.

When tree select control signal TS[4] is in an active state, remaining tree select control signals TS[5–7] are not active. This causes inverter $506_1$ to drive one input of NAND gate $502_1$ with a logic high signal, and inverters $506_2$ through $506_3$ to drive respective inputs of NAND gates $502_2$ through $502_3$ with a logic low signal. Assuming configuration bit LP[0] is in an active state, the output of NAND gate $502_1$ will drive gate control terminal CTL[1] with a logic low signal. As described above, when a gate control terminal of gated tap delay circuit 202 is driven with a logic low signal, the tap coupled to the gate control terminal is deactivated. This also causes all the taps above the deactivated tap to be deactivated. Thus, if gate control terminal CTL[1] is driven with a logic low signal, only four taps are activated (taps giving rise to delayed output signals D[0–3]). On the other hand, if tree select control signal TS[5] is in an active state, then gate control terminal CTL[2] will be driven with a logic low signal instead. Note gate control terminal CTL[1] is now driven with a logic high signal due to the change in state of tree select control signal TS[4]. TABLE 2 shows a truth table summarizing the operation of gated tap control circuitry 206 for an active low embodiment.

TABLE 2

| TS[7] | TS[6] | TS[5] | TS[4] | CTL[3] | CTL[2] | CTL[1] |
|-------|-------|-------|-------|--------|--------|--------|
| 1 | 1 | 1 | 0 | 1 | 1 | 0 |
| 1 | 1 | 0 | 1 | 1 | 0 | 1 |
| 1 | 0 | 1 | 1 | 0 | 1 | 1 |
| 0 | 1 | 1 | 1 | 1 | 1 | 1 |

To better illustrate the operation of a delay line such as shown in FIGS. 4 and 5, assume delayed output signal D[3] is to be selected as output signal OUT. Delay control terminals DC[0–3] are driven with a value of 0010 (Gray code representation of decimal 3). Multiplexer controller 406 drives tree select control terminals TS[0–7] with a value of 11100111. Thus, tree select control signals TS[3] and TS[4] are in an active state (active low in the exemplary embodiment). Tree select control signal TS[3] causes the output of multiplexer $402_0$ to be input I[3] of multiplexer $402_0$, which is driven by delayed output signal D[3]. Tree select control signal TS[4] causes the output of multiplexer 404 to be input I[0] of multiplexer 404, which is driven by delayed output signal D[3] from multiplexer $402_0$. Tree select control signals TS[4–7] cause gate control terminals CTL[1–3] to be driven with the value 110. Since gate control signal CTL[1] is driven with a logic low signal, the last twelve taps in gated tap delay circuit 202 are disabled. Thus, output signal OUT is driven with delayed output signal D[3] using only the first four taps in gated tap delay circuit 202.

Accordingly, tap selection is selectively controlled. Thus, which tap or taps of gated tap delay circuit 202 are to be activated during a delay operation may be selected in a controllable manner. This reduces power dissipation and jitter within gated tap delay circuit 202 when operating with a short delay. Although the present invention has been described with respect to a Gray code multiplexing scheme, those skilled in the art will appreciate that the present invention can be used with other multiplexing schemes. A different multiplexing scheme merely requires a modification of the truth table of TABLE 1. In addition, although the present invention has been described with respect to an active low embodiment of multiplexer 204, those skilled in the art will appreciate that the present invention can be used with multiplexer 204 in an active high embodiment.

Figure 6:
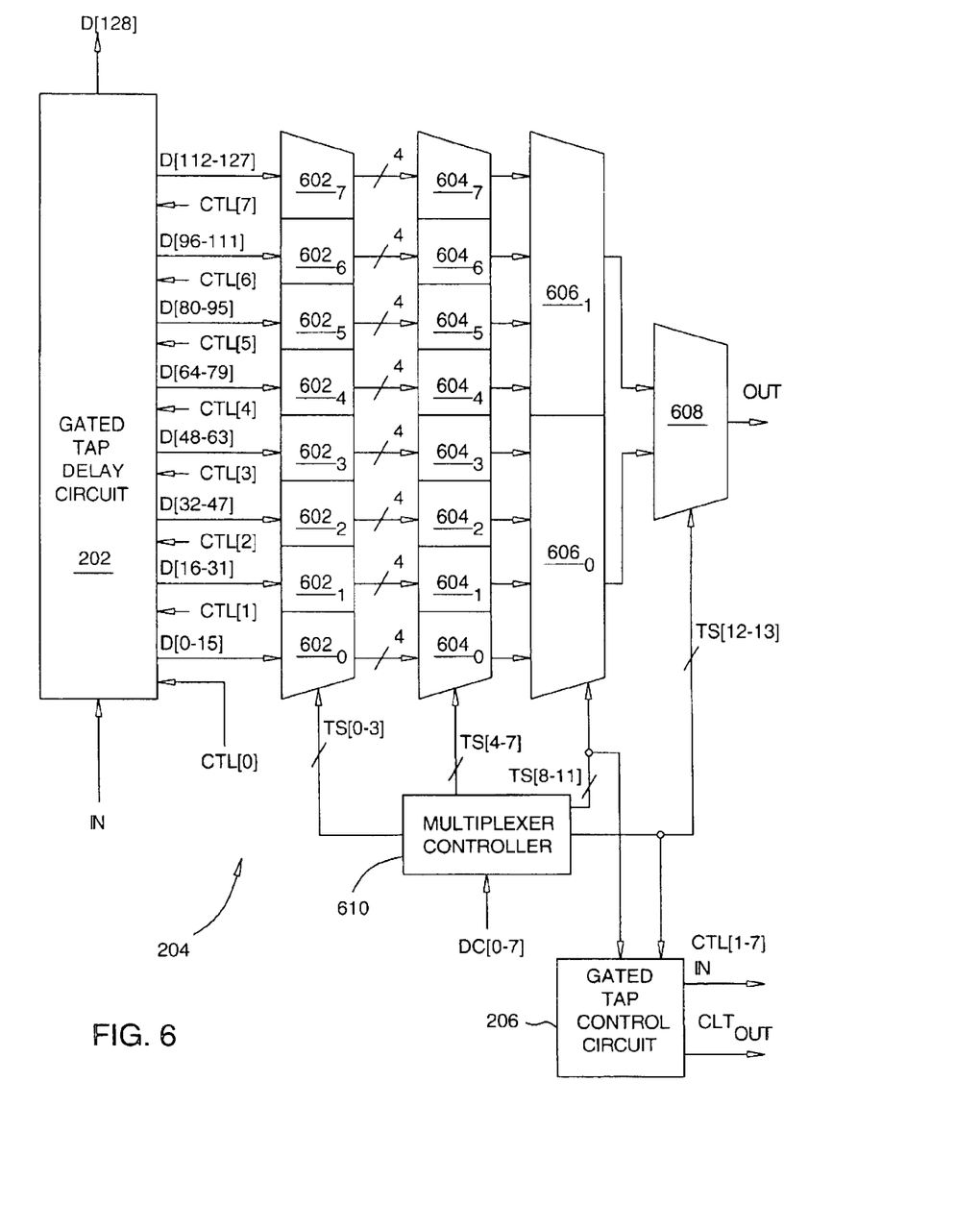
FIG. 6 depicts a block diagram of a 128-tap delay line in accordance with one or more aspects of the present invention.

FIG. 6 depicts a more detailed block diagram showing another exemplary embodiment of delay line 200 in accordance with one or more aspects of the present invention. Elements that are similar to those described with respect to FIG. 2 are designated with identical reference numerals and are described above. In this illustrative embodiment, delay line 200 implements a gated tap delay circuit 202 having 128 taps for delaying input signal IN. Multiplexer 204 of delay line 200 is a four level Gray code multiplexer tree including multiplexers $602_0$ through $602_7$ (collectively referred to as multiplexers 602), multiplexers $604_0$ through $604_7$ (collectively referred to as multiplexers 604), multiplexers $606_0$ and $606_1$ (collectively referred to as multiplexers 606), multiplexer 608, and multiplexer controller 610. Multiplexer controller 610 is configured to receive delay control signals DC[0–7] (an eight-bit delay control signal is required to control 128 taps) and to generate tree select control lines TS[0–13]. Tree select control lines TS[0–13] control multiplexers 602, 604, 606, and 608 to select an appropriate delayed output signal, as explained in greater detail below.

Multiplexers 602 are 16-to-4 multiplexers that select four of the 16 input signals as output signals. Thus, multiplexers 602 are each coupled to receive a 16-member subset of delayed output signals and drive four output signals. The output signals of each of multiplexers 602 are coupled to multiplexer 604. Multiplexers 602 are controlled in parallel by tree select control lines TS[0–3].

Multiplexers 604 are 4-to-1 multiplexers that select one of the four input signals to drive as an output signal. Thus, each multiplexer 604 is configured to receive four signals from respective ones of multiplexers 602 and to drive an output signal. The output signal of each of multiplexers 604 is coupled to multiplexers 606. Multiplexers 604 are controlled in parallel by tree select control lines TS[4–7].

Multiplexers 606 are 4-to-1 multiplexers that select one of the four input signals to drive as an output signal. Thus, each multiplexer 606 is configured to receive four signals from respective ones of multiplexers 604 and to drive an output signal. The output signal of each of multiplexers 606 is coupled to multiplexer 608. Multiplexers 606 are controlled in parallel by tree select control lines TS[8–11].

Multiplexer 608 is a 2-to-1 multiplexer that selects one of the two input singles to drive as output signal OUT. Thus, multiplexer 608 is configured to receive two signals from respective ones of multiplexers 606 and to drive an output signal. Multiplexer 608 is controlled by tree select control lines TS[12–13].

In the exemplary embodiment, taps of gated tap delay circuit 202 are turned off and on at a granularity of 16 taps. Thus, gated tap delay circuit 202 includes eight gate control terminals CTL[0–7]. Gate control terminal CTL[0] controls activation of the entire delay line. Thus, when gate control signal CTL[0] is driven by an active signal (logic high signal), gated tap delay circuit 202 is activated. Gate control terminals CTL[1–7] are driven by respective gate control signals CTL[1–7] output from gated tap control circuitry 206. Gated tap control circuitry 206 is configured to receive tree select control signals TS[8–13]. Gated tap control circuitry 206 determines from tree select control signals which taps will not be used to provide the selected delay to the input signal, and thus generate the requisite gate control signals CTL[1–7] for disabling unused taps. Since taps are turned on and off at a granularity of 16 taps, gated tap control circuitry 206 only requires information from tree select control signals TS[8–13].

Figure 7:
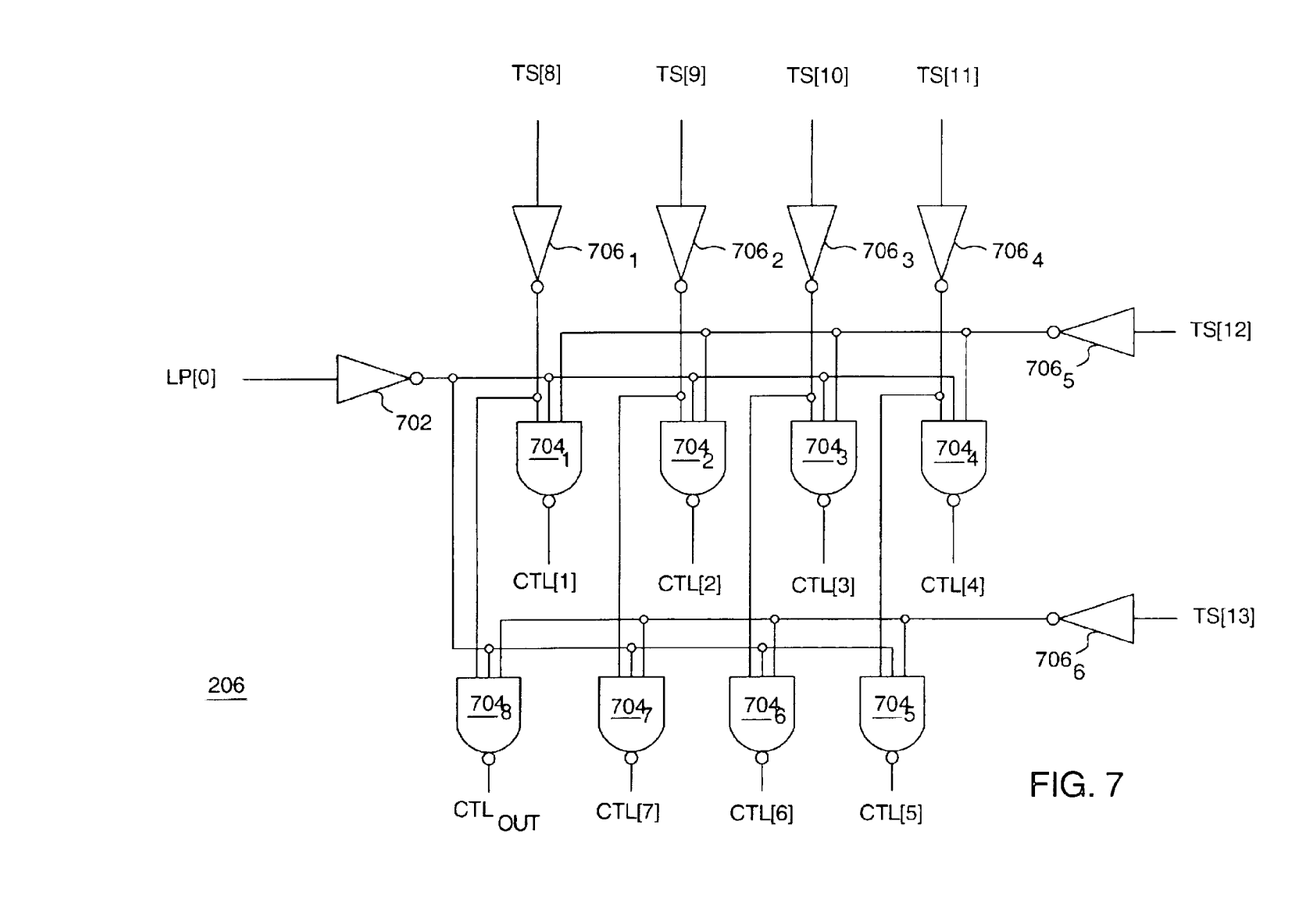
FIG. 7 depicts a block diagram of a gated tap control circuit for the 128-tap delay line of FIG. 6 in accordance with one or more aspects of the present invention.

FIG. 7 depicts a more detailed schematic diagram showing another exemplary embodiment of gated tap control circuitry 206 for controlling a 128-tap gated tap delay circuit. Gated tap control circuitry 206 outputs gate control signals CTL[1–7] for controlling taps at a granularity of 16 taps. Gated tap control circuitry 206 includes a plurality of NAND gates $704_1$ through $704_8$ (collective referred to as NAND gates 704), an inverter 702, and a plurality of inverters $706_1$ through $706_6$ (collectively referred to as inverters 706). Those skilled in the art will appreciate that other types of logic gages can be used, such as AND gates, to provide gate control signals. Configuration signal LP[0] is coupled to inverter 702. Output of inverter 702 is coupled to an input of each of NAND gates 704. As described above, configuration signal LP[0] enables or disables this gate control feature.

Tree select control signals TS[8–13] are respectively coupled to inverters $706_1$ through $706_6$. Output from inverter $706_5$ is coupled to the first four NAND gates $704_1$ through $704_4$. Output from inverter $706_6$ is coupled to the next four NAND gates $704_5$ through $704_8$. Inverter $706_5$ thus controls activation of taps within the first 64 taps, whereas inverter $706_6$ controls activation of taps within the last 64 taps. Output from inverter $706_1$ is coupled to NAND gates $704_1$ and $704_8$. Output from inverter $706_2$ is coupled to NAND gates $704_1$ and $704_7$. Output from inverter $706_3$ is coupled to NAND gates $704_3$ and $704_6$. Output from inverter $706_4$ is coupled to NAND gates $704_4$ and $704_5$.

Only one of tree select control signals TS[8–13] is in an active state at any one time (active low in the exemplary embodiment). The state of gate control signals CTL[1–7] and $CTL_{OUT}$ depend on which tree select control signal TS[8–13] are in an active state, substantially as described above with respect to FIGS. 4 and 5. The gate control signal $CTL_{OUT}$ may be used to cascade more than one delay line together.

Assume the basic delay, D, of a gated tap is approximately 160 ps. Assume also that gated-tap delay circuit 202 includes 256 taps, and that gated-tap delay circuit 202 is used in a tap controlled oscillator (TCO) circuit to generate a frequency of around 150 MHz. Assuming an intrinsic delay of gated-tap delay circuit 202 is approximately 773 ps (the delay through multiplexer 204 and other necessary circuitry other than the removed gated-taps), then only 16 taps are enough to generate the target frequency of 150 MHz. This enables the use of only 16 taps in the 256-tap delay line. This prevents all 256 taps from switching at a frequency of 150 MHz, leading to a power savings by a factor of 16. For the same reason, the amount of generated supply noise (di/dt) is reduced by a factor of 16, which leads to less jitter.

The power dissipation and jitter benefits provided by the present invention increases with frequency of operation. This is because the relative jitter is $d(T_d)/T_d$, where $T_d$ is the total delay of the gated taps and d represents the first derivative. If frequency of operation increases, $T_d$ decreases. If all taps in the delay line are running, $d(T_d)$ would increase. By disabling unused taps, both $d(T_d)$ and $T_d$ decrease with a frequency increase, leading to lower relative jitter. Since some digital clock management circuits can comprise more than 1000 taps, a significant reduction in jitter and power dissipation may be attained.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps.

What is claimed is:

1. An apparatus for an integrated circuit, comprising:
   delay elements serially coupled to provide a delay line, the delay elements configured to receive a digital input signal to be progressively delayed;
   each of the delay elements including logic components serially coupled;

each delay element of the delay elements having a first logic component of the logic components having at least two inputs, the first logic component configured to gate the at least two inputs;

a first input of the at least two inputs coupled for receiving one of a progressively delayed version of the digital input signal and a progressively delayed inverted version of the digital input signal, the first input of the at least two inputs coupled in series with a second logic component of the logic components;

a first portion of the delay elements having a second input of the at least two inputs of the first logic component coupled for receiving a reference voltage;

a second portion of the delay elements having the second input of the at least two inputs of the logic component coupled for receiving a control signal; and the delay elements of the second portion of the delay elements spaced apart by being coupled through at least one of the delay elements of the first portion of the delay elements.

2. The apparatus, according to claim 1, wherein the delay elements of the second portion of the delay elements are spaced apart by four of the delay elements of the first portion of the delay elements.

3. The apparatus, according to claim 1, wherein the delay line is coupled to a phase detector.

4. The apparatus, according to claim 3, wherein the delay line is coupled to configurable logic circuits.

5. The apparatus, according to claim 4, wherein the integrated circuit is a programmable logic device selected from a complex programmable logic device and a field programmable gate array.

6. The apparatus, according to claim 1, further comprising a data output disposed proximally between each of the delay elements to provide data outputs.

7. The apparatus, according to claim 6, further comprising at least one multiplexer coupled to the data outputs.

8. The apparatus, according to claim 1, wherein the delay line is coupled to a controller, the controller configured to provide control signals, the control signals respectively provided to the second input of the at least two inputs of the logic component of the second portion of the delay elements, the control signal of the control signals for selective control of the delay line downstream of the second input of the at least two inputs of the logic component of each of the delay elements of the second portion of the delay elements.

9. The apparatus, according to claim 8, wherein the second portion of the delay elements are configured to output a constant logic signal responsive to the control signal.

10. The apparatus, according to claim 9, wherein the second portion of the delay elements are configured to output the constant logic signal regardless of the progressively delayed version of the digital input signal or the progressively delayed inverted version of the digital input signal received by the second portion of the delay elements.

11. The apparatus, according to claim 10, wherein the logic components comprise a NAND gate and three inverters, wherein the NAND gate is the first logic component, and wherein the constant logic signal is a logic high signal.

12. The apparatus, according to claim 11, wherein the three inverters and the input of the NAND gate are coupled in series.

13. The apparatus, according to claim 12, wherein the reference voltage is a supply voltage.

14. The apparatus, according to claim 12, wherein the reference voltage is a ground.

15. A method for delaying a digital signal, comprising:

receiving the digital signal to a delay line, progressively delaying the digital signal with the delay line, the progressively delaying of the digital signal including:

passing the digital signal through logic gates of the delay line, the logic gates separated by output taps of the delay line, the passing including:

receiving the digital signal to a first input of each of the logic gates of a first portion of the logic gates;

receiving a reference level voltage to a second input of each of the logic gates of the first portion of the logic gates;

receiving the digital signal to a first input of each of the logic gates of a second portion of the logic gates; and respectively receiving control signals to a second input of each of the logic gates of the second portion of the logic gates, the logic gates of the second portion of the logic gates spaced apart by being coupled through at least one of the logic gates of the first portion of the logic gates.

16. The method, according to claim 15, further comprising selectively deactivating a portion of the delay line responsive to a control signal of the control signals.

17. The method, according to claim 16, wherein the portion of the delay line deactivated is downstream of the control signal.

18. The method, according to claim 17, wherein the delay line comprises delay elements, each of the delay elements configured to receive the digital signal and to provide a progressively delayed version of the digital signal when not deactivated.

19. The method, according to claim 18, the delay elements of the portion of the delay line deactivated are configured to provide a constant logic version regardless of the digital signal received.

20. An apparatus for an integrated circuit, comprising:

a delay line, the delay line having delay stages delineated by output taps, the output taps for providing outputs, the delay stages selectively controllable with control signals;

selection circuitry configured to select at least one of the outputs of the delay line responsive to select control signals; and control circuitry configured to generate the control signals responsive to at least a portion of the select control signals.

21. The apparatus, according to claim 20, wherein a first portion of the delay stages are selectively controllable with the control signals; wherein a second portion of the delay stages are not selectively controllable; and wherein the delay stages of the first portion are spaced apart by at least one of the delay stages of the second portion.

22. The apparatus, according to claim 20, wherein number of the output taps is greater in number to that of the control signals by a factor of at least two.

23. The apparatus, according to claim 20, wherein number of the output taps is equal in number to that of the control signals.

* * * * *